United States Patent [19]

Muller

[11] Patent Number: 5,260,900
[45] Date of Patent: Nov. 9, 1993

[54] METHOD AND APPARATUS FOR ACCESSING NON-VOLATILE MEMORY

[75] Inventor: Arno Muller, Westport, Conn.

[73] Assignee: Pitney Bowes Inc., Stamford, Conn.

[21] Appl. No.: 695,154

[22] Filed: May 3, 1991

[51] Int. Cl.$^5$ .................. G11C 11/34; G06F 15/20
[52] U.S. Cl. ........................... 365/189.01; 365/191; 364/464.02
[58] Field of Search .............. 364/464.02; 365/189.01, 365/191

[56] References Cited

U.S. PATENT DOCUMENTS

| | | | |
|---|---|---|---|
| 4,998,203 | 3/1991 | DiGiulio et al. | 364/464.02 |
| 5,051,564 | 9/1991 | Schmidt | 364/464.02 |

*Primary Examiner*—Margaret R. Wambach
*Attorney, Agent, or Firm*—Charles G. Parks, Jr.; Melvin J. Scolnick

[57] ABSTRACT

A method and system for accessing a non volatile memory for writing data therein, wherein the memory has a write accessing input. A control circuit produces successive enable signals, and a hardware device is connected to apply signal to the write accessing terminal of said memory only in response to a plurality of successive enable signals.

2 Claims, 1 Drawing Sheet

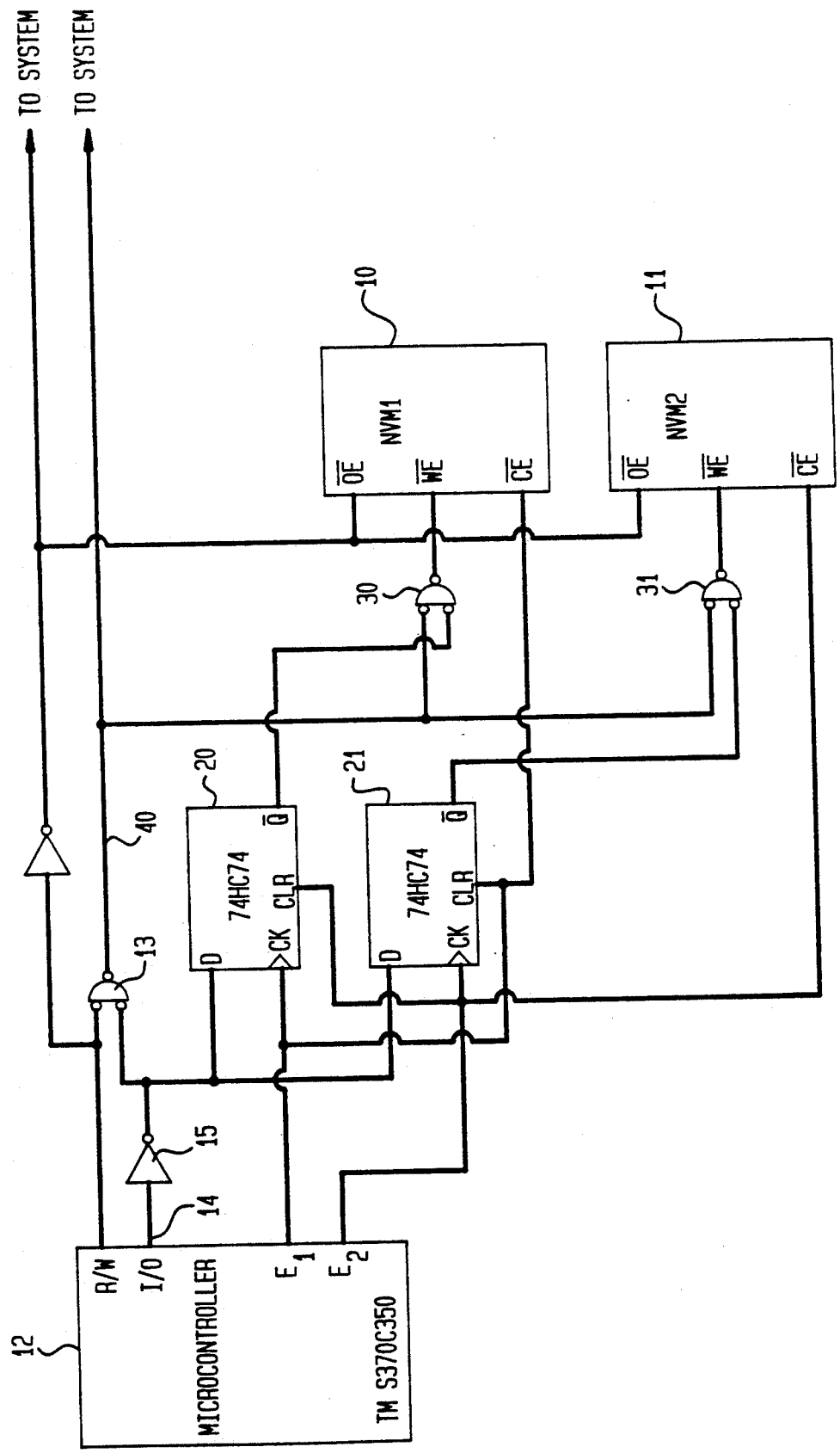

METHOD AND APPARATUS FOR ACCESSING NON-VOLATILE MEMORY

FIELD OF THE INVENTION

This invention relates to a method and apparatus for increasing the security of data in non volatile memory (NVM). While the invention is especially adapted for enabling the secure access to fund data in a postage meter, the invention is also useful in other applications.

BACKGROUND OF THE INVENTION

In the storage of data in non volatile memory, it is frequently necessary to ensure that erroneous writing to the memory cannot occur. This is of especial importance where the memory is adapted to store accounting data, such as, for example only, the funding registers of a postage meter. In some solutions to this problem, redundant memories are provided in order to store the same information in more than one memory. While this technique increases the possibility of detecting the writing of erroneous data into the memory, it is not primarily directed to the problem of minimizing the possibility of erroneous accessing of the memories.

SUMMARY OF THE INVENTION

The present invention is therefore directed to the provision of a method and apparatus for minimizing the possibility of the erroneous accessing of a non volatile memory for the writing of data therein.

In accordance with the invention, the process of writing data to an NVM requires several steps in the software algorithm, the steps including the control of hardware, e.g. a flip flop, which prevents writing in the normal state of the system. As a consequence, the accidental writing to NVMs in the system when there is a malfunction is reduced. In addition, the chance of randomly writing more than one byte in the NVM becomes statistically insignificant.

Further, in accordance with the invention, in order to store data in NVMs, they must be unlocked by accessing them twice. The first access can be a read or a write with an output of the microcontroller set to a low level for disabling all external writing to devices (NVMs, RAM and LATCH) in the system. This step unlocks the addressed NVM memory. The output is then set high (its normal default level) for a second write step which is effective at the unlocked NVM. Any access to an NVM after the first write, be it a read or write, will again disable writing in the NVMs.

In the system of the invention, a hardware failure in the NVM locking circuit causes a fatal error condition.

BRIEF DESCRIPTION OF THE DRAWING

In order that the invention may be more clearly understood, it will now be disclosed in greater detail with reference to the accompanying drawing, wherein the single figure of the drawing is a circuit diagram of a preferred circuit in accordance with the invention.

DETAILED DISCLOSURE OF THE INVENTION

Referring now to the drawing, a non volatile memory circuit in accordance with the invention includes redundant nonvolatile memories 10 and 11. These memories are preferably manufactured by different companies, and may have the same or different write modes (i.e. page write mode and byte write mode). As an example, a suitable memory having a page write mode is the Seeq 28C64, and a suitable memory having a byte write mode is an Atmel AT28C64. Each of the memories has a /write enable terminal and a /chip enable terminal. The conventional addressing and data line connections to the chips are omitted for the sake of clarity.

A microcontroller 12, such as, for example only, a type TMS370C350, has a read write terminal R/W for applying read/write signals to the remainder of the system. In accordance with the invention, this terminal is not connected directly to the read/write lines of the system, but instead is applied to one input of an inverted input NAND gate 13. An I/O port terminal 14 is coupled via an inverter 15 to the other input of the gate 13, as well as to the D terminals of a pair of D type edge triggered flip flops 20, 21, such as type 74HC74.

A further output port terminal $E_1$ of the microcontroller 12 is connected to the clock terminal of the flip flop 20, as well as to the clear terminals of the flip flop 21 and the /chip enable terminal of the NVM1 10. A still further output port terminal $E_2$ of the microcontroller 12 is connected to the clock terminal of the flip flop 21, as well as to the clear terminal of the flip flop 20 and the chip enable terminal /CE of the NVM 11.

The output of the gate 13, i.e. the read write line of the system, is connected to one input of an inverted input NAND gate 30, as well as to one input of the inverted NAND gate 31. The other inputs of these gates are derived from the /Q outputs of the flip flops 20 and 21, respectively, and the outputs of these gates are connected to the /WE terminals of the NVMs 10 and 11, respectively.

In the illustrated circuit, when the R/W terminal of the microcontroller 12 is set low, the read/write line 40 of the system will not be pulled low, for a write command, unless the I/O terminal of the microcontroller 12 is also brought high, so that the output of the inverter 15 is low, in view of the connection of the R/W terminal and the output of the inverter 15 to the gate 13. As is apparent, however, even if the read/write line 40 is brought low, a low write signal is not applied to either of the NVMs 10 or 11, unless the output of the /Q terminal of the respective flip flop 20, 21 is also low.

The I/O terminal output is normally held high, so that the output of the inverter 15 is low and hence enables the gate 13 to pass normal write signals to the remainder of the system. In this condition, a low is continually applied to the D terminals of the flip flops, so that when the terminals $E_1$ or $E_2$ are pulsed for reading, the flip flops are cleared and a low would not appear at the /Q terminals of the NVMs.

In order to write in NVM1, it is first necessary to block the system read/write line 40 from permitting an system writes. This is effected by bringing the level at the I/O terminal low, so that the resultant high output of the inverter 15 blocks the gate 13, and applies a high to the D inputs of the flip flops 20 and 21. If an enable pulse is now output from the $E_1$ terminal, the high at the D input of the flip flop 20 is clocked to provide a low at the /Q output thereof, to hence enable the gate 30. Since the level of line 40 is high at this time, however, the NVM1 is not enabled to write. The output of the I/O terminal of the microcontroller 12 is now pulled high, to apply a low to the input of the gate 13 (thereby permitting the passage of write signals from the R/W terminal), and a low is also applied to the D inputs of the flip flops 20, 21. An enable pulse from the enable line $E_1$ can now clock the flip flop 20 to provide a low at its /Q output at the trailing edge of the pulse, and a write signal from the R/W terminal can pass the gates 13 and 30, so that a /WE signal can be applied to the /WE terminal of the NVM1. When the $E_1$ pulse now goes low, the low signal is applied to the chip enable terminal /CE of NVM1, to enable the NVM1 to receive data at any designated address. While the termination of this second $E_1$ pulse also cause the /Q terminal of the flip flop 20 to be driven high, the gate 30 is held open during the pulse to permit the writing of data in the NVM.

During the accessing of each of the NVMs using the enable pulses at the $E_1$ and $E_2$ terminals, the pulses are a also applied to the clear terminals of the flip flop associated with the other NVM. As a result, it is not possible in the system of the invention to access both of the NVMs at the same time.

The procedure for accessing the NVM2 is the same as that stated above, with the exception that in case the enable signal is derived from the $E_2$ terminal of the microcontroller 12.

In accordance with the invention, the hardware, i.e. the flip flops 20, 21 are thus connected and controlled to require the program of the microcontroller 12 to make two attempts to access the NVMs for writing data therein. Since the flip flops are reset after each write, the procedure must be repeated for each step of writing data to the NVMs. Accordingly, the possibility of accessing the NVMs in error for writing data therein is practically nil, and the security of the system is enhanced. This is of great importance in systems requiring secure accounting, such as, but not limited to, postage meters and the like.

It will of course be apparent that the invention is not limited to the use of flip flops as described above, and that other hardware or simulated hardware devices or systems may be employed, as long as the devices can be controlled to reliably require at least two software accessing steps to effect a write to the NVMs.

While the invention has been disclosed and described with reference to a single embodiment, it will be apparent that variations and modification may be made therein, and it is therefore intended in the following claims to cover each such variation and modification as falls within the true spirit and scope of the invention.

What is claimed is:

1. A system for accessing a memory for writing data therein, comprising a non volatile memory having an write accessing input, a microcontroller having a R/W terminal, an I/O terminal and an enable terminal, a hardware device having at least two stable states, said hardware device having a first state for blocking the application of signals to said write accessing input and a second state for permitting the application of signals to said write accessing input, and further comprising means responsive to a first and second signals output from said I/O terminal for enabling and blocking, respectively, the output of write signals from said R/W terminal, and whereby said hardware device is set to said first or second states responsive to a signal at said enable terminal and first or second signals, respectively said microcontroller applying said first signal to said I/O terminal while applying an enable pulse to said enable terminal, and applying said second signal to said I/O terminal while applying a next subsequent enable signal to said enable terminal, whereby said hardware device enables the application of signals to said write accessing input only in response to two successive enable signals.

2. The system of claim 1 wherein said hardware device is a flip flop.

* * * * *